United States Patent
Tyson et al.

(10) Patent No.: US 10,097,203 B2
(45) Date of Patent: Oct. 9, 2018

(54) LANE-STRIPED COMPUTATION OF PACKET CRC TO MAINTAIN BURST ERROR PROPERTIES

(71) Applicant: Nvidia Corporation, Santa Clara, CA (US)

(72) Inventors: Eric Tyson, Santa Clara, CA (US); Stephen D. Glaser, Santa Clara, CA (US); Mike Osborn, Santa Clara, CA (US); Mark Hummel, Santa Clara (CA)

(73) Assignee: Nvidia Corporation, Santa Clara, CA (US)

( * ) Notice: Subject to any disclaimer, the term of this patent is extended or adjusted under 35 U.S.C. 154(b) by 106 days.

(21) Appl. No.: 14/939,813

(22) Filed: Nov. 12, 2015

(65) Prior Publication Data

US 2017/0141794 A1    May 18, 2017

(51) Int. Cl.
*H03M 13/09* (2006.01)
*G06F 11/10* (2006.01)
*H04L 1/00* (2006.01)

(52) U.S. Cl.
CPC ........... *H03M 13/091* (2013.01); *G06F 11/10* (2013.01); *G06F 11/1004* (2013.01); *G06F 11/1076* (2013.01); *H03M 13/09* (2013.01); *H04L 1/0061* (2013.01); *H04L 1/0066* (2013.01)

(58) Field of Classification Search
CPC . H03M 13/091; H03M 13/09; G06F 11/1004; G06F 11/1076; G06F 11/10; H04L 1/0061; H04L 1/0066
USPC .... 714/758, 763, 776, 779, E11.032, E11.04
See application file for complete search history.

(56) References Cited

U.S. PATENT DOCUMENTS

| | | | | | |
|---|---|---|---|---|---|
| 5,410,546 | A | * | 4/1995 | Boyer | G06F 11/10 714/763 |
| 6,141,784 | A | * | 10/2000 | Davis | G08C 25/02 370/473 |
| 6,173,431 | B1 | * | 1/2001 | Rittle | H03M 13/2918 714/746 |
| 6,282,691 | B1 | * | 8/2001 | Sakata | H03M 13/09 714/807 |
| 6,681,364 | B1 | * | 1/2004 | Calvignac | H03M 13/091 714/776 |
| 6,961,893 | B1 | * | 11/2005 | Mukund | H03M 13/091 714/781 |
| 7,386,621 | B1 | * | 6/2008 | Hlasny | H04L 12/1868 370/471 |
| 7,801,121 | B1 | * | 9/2010 | Van Wageningen | H04Q 11/04 370/242 |

(Continued)

*Primary Examiner* — John J Tabone, Jr.
(74) *Attorney, Agent, or Firm* — Rich Domingo; Parker Justiss, P.C.

(57) ABSTRACT

A CRC generator, a method for computing a CRC of a data packet, and an electronic system, such as a circuit board, are disclosed herein. In one embodiment the method is for computing the CRC of a data packet to be transmitted on a serial communications link having multiple lanes. In one embodiment, the CRC generator includes: (1) a CRC calculator configured to define a CRC calculation of a data packet in sequential order and perform parallelized computations, according to the sequential order and the multiple lanes, to generate sub-CRC values and (2) combination circuitry configured to combine the sub-CRC values to provide the CRC value for the packet.

20 Claims, 4 Drawing Sheets

(56) References Cited

U.S. PATENT DOCUMENTS

| | | | | |
|---|---|---|---|---|
| 2002/0053059 A1* | 5/2002 | Hara | ................... | H03M 13/091 |
| | | | | 714/758 |
| 2002/0066059 A1* | 5/2002 | Hara | ................. | H03M 13/091 |
| | | | | 714/755 |
| 2006/0106946 A1* | 5/2006 | Agarwal | ................. | H04L 69/16 |
| | | | | 709/250 |
| 2007/0234134 A1* | 10/2007 | Shao | .................... | H04L 1/0061 |
| | | | | 714/701 |
| 2008/0065796 A1* | 3/2008 | Lee | .................... | G06F 12/1416 |
| | | | | 710/71 |
| 2008/0244120 A1* | 10/2008 | Park | ..................... | G06F 13/385 |
| | | | | 710/65 |
| 2009/0024900 A1* | 1/2009 | Wilkinson | ........ | H03M 13/2906 |
| | | | | 714/758 |
| 2015/0280741 A1* | 10/2015 | Bryant | ................ | H03M 13/093 |
| | | | | 714/807 |

* cited by examiner

LANE-STRIPED COMPUTATION OF PACKET CRC TO MAINTAIN BURST ERROR PROPERTIES

TECHNICAL FIELD

This application is directed, in general, to a communication protocol and, more specifically, to error detection in serial communication links having multiple transmission lanes.

BACKGROUND

Data sent across serial interfaces is grouped into packets. Typically, these packets contain a header and a payload. To detect errors (and perhaps repair them), a cyclic redundancy check (CRC) is calculated against an entire packet and added to the packet so a receiver can determine if the packet was corrupted in its transmission. A given CRC calculation enables detection of at most a certain number of random bit errors and at most a certain number of sequential bit errors.

SUMMARY

In one aspect, the disclosure provides a CRC generator. In one embodiment, the CRC generator includes: (1) a CRC calculator configured to define a CRC calculation of a data packet in sequential order and perform parallelized computations, according to the sequential order and the multiple lanes, to generate sub-CRC values and (2) combination circuitry configured to combine the sub-CRC values to provide the CRC value for the packet.

In another aspect, the disclosure provides a method for computing a CRC of a data packet for transmitting on a serial communications link having multiple lanes. In one embodiment, the method includes: (1) defining a calculation for a CRC value of a data packet in sequential order, (2) calculating, in parallel, a sub-CRC value of the CRC value for each lane of the multiple lanes, and (3) generating the CRC value for the data packet based on a combination of each the sub-CRC value.

In yet another aspect, a circuit board is disclosed. In one embodiment, the circuit board includes: (1) a first device, (2) a second device, and (3) a serial communications link having multiple lanes communicatively coupling the first device to the second device, the serial communications link including a transmitter having a CRC generator comprising: (3A) a CRC calculator configured to define a CRC of a data packet in sequential order and perform parallelized computations according to the multiple lanes to generate sub-CRC values and (3B) combination circuitry configured to combine the sub-CRC values to provide a CRC value for the data packet.

BRIEF DESCRIPTION

Reference is now made to the following descriptions taken in conjunction with the accompanying drawings, in which.

DETAILED DESCRIPTION

Figure 1:
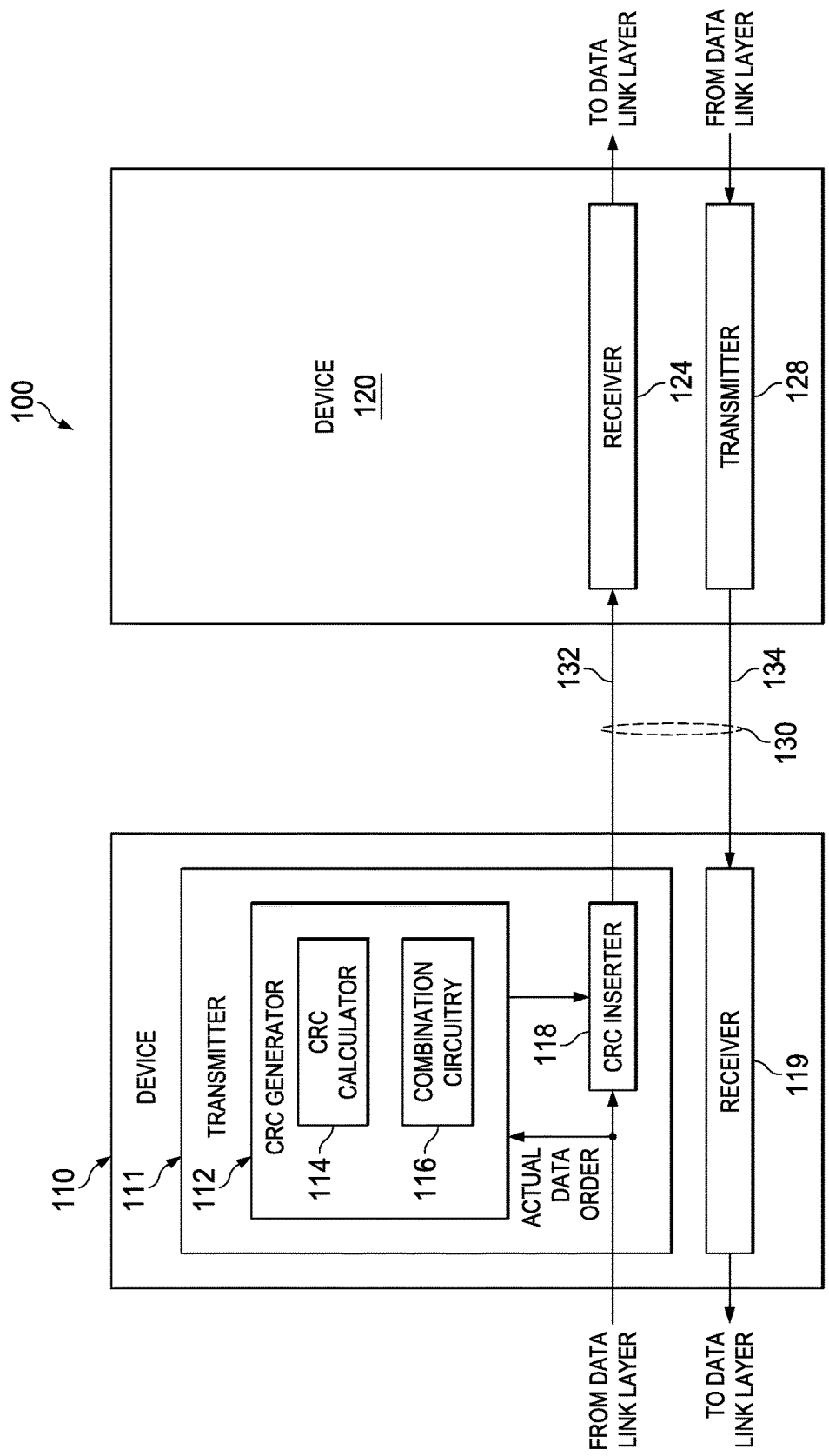
FIG. 1 illustrates a block diagram of an embodiment of an electronic circuit board constructed according to the principles of the disclosure.

In some serial communications links, the bits of a packet covered by the CRC are sent to multiple lanes. For example, a communications link can transmit data of a packet according to its "data beat" such as 128 bits (referred to herein as a flit) at a time. The transmitter divides the bits of each flit of a packet across the number of wires or physical lanes of a link that are used transmit the data to a receiver. The CRC for the packet, however, is calculated in a logic stage preceding its distribution to these physical lanes (referred to hereafter as lanes).

It is realized herein that if the CRC was simply calculated in traditional order from lane-symbol 0 to N−1, from flit 0 to M−1, then the sequential bit error detection property would be lost because bits are serialized onto the lanes in a different order. Furthermore, it is realized herein that it is not a trivial matter to rearrange the CRC computation to match the lane-sequential order and perform per-flit CRC sub-computations upon arrival and without storing the entire packet.

Accordingly, the disclosure provides a CRC computation striping scheme for packets transmitted over multiple lanes of a serial communications link. The serial communications link can be a high speed interconnection with point to point connections between devices. The devices may be different die within a multi-chip module (MCM) or different packages on a printed circuit board (PCB). In some embodiments, the serial communications link transmits data at up to 25 Gbps across each lane.

The disclosed scheme maintains sequential error detection for packets even though they are sent over multiple lanes. As such, the CRC computation striping scheme protects against burst error properties associated with the electrical properties of the transmission wires used for the lanes. Advantageously, the actual CRC calculation can be performed on live data without additional storage or deferred computation. Accordingly, the CRC calculations are performed in real time, i.e., the actual time in which the data packet is being transmitted. The CRC computation striping scheme, therefore, maintains burst error properties and does it at a line rate without buffering a whole packet before computing CRC.

Consider, for example, a serial communications link of N lanes wherein each lane transmits symbols, comprised of a fixed number of bits, in order from flit 0 to flit M−1. The serial communications link transmits data packets that are M×N-symbol-long data packets constructed of lane-symbols 0 to N−1, from flit 0 to M−1. In one embodiment, the CRC computation striping scheme defines the logical CRC calculation for the data packet in a sequential order by (symbol number, flit number) that matches the order in which each lane will sequentially transmit symbols. For this example, the sequential order by (symbol number, flit number) is defined by: (0,0); (0,1); (0,2); . . . ; (0,M−1); (1,0); . . . ; (1, M−1); (2,0); . . . (N−1, M−1). Accordingly, the sequential error detection property is maintained.

Figure 3:
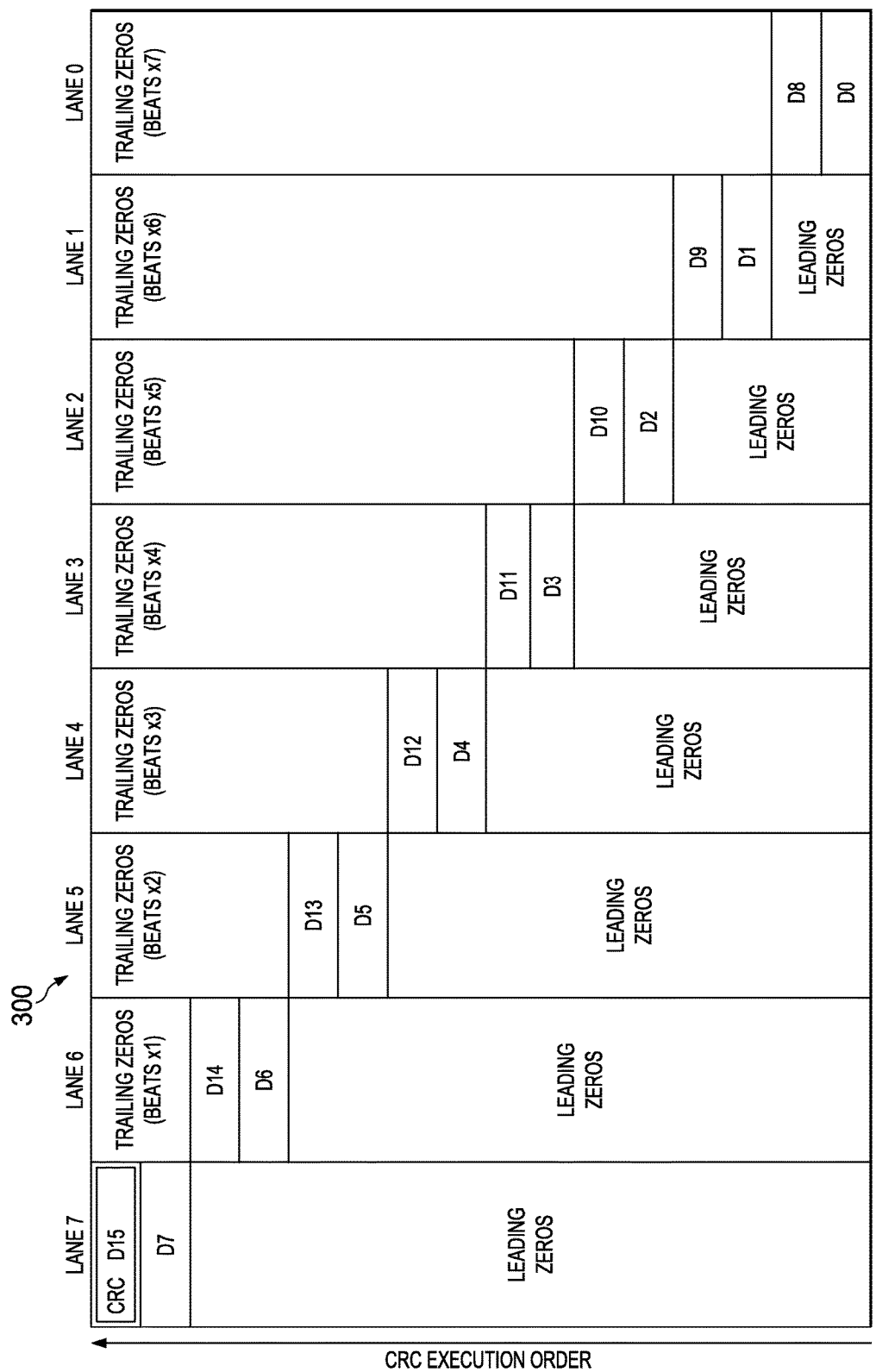
FIG. 3 illustrates a diagram representing an embodiment of an execution order for calculating a CRC for the data packet of FIG. 2 carried out according to the principles of the disclosure.

The disclosed striping scheme then performs parallelized computations based on the sequential order and the multiple lanes to generate sub-CRC values. The parallelized computations include performing N (number of lane-symbols) computations in parallel, with each lane's running sub-CRC value initializing with an appropriate number of leading zeroes. FIG. 3 illustrates parallelized computations according to one embodiment. For computing the final packet CRC value, each of the per-lane running CRC values, i.e., the sub-CRC values, is adjusted for a correct number of trailing zeroes such that each sub-CRC value is effectively the CRC value of the M×N-long string: 0, 0, . . . , 0, symbol (i, 0), symbol (i, 1), . . . , symbol (i,M−1), 0, . . . , 0, wherein symbol (i,j) is the symbol in lane i at flit j. These N sub-CRCs are combined together to achieve a CRC value for the entire packet. As discussed herein, the N sub-CRCs can be XORed together to achieve the CRC value for the entire packet.

In one embodiment, the CRC striping scheme employs precomputed, fixed values for leading or trailing zero adjustments. Accordingly, the parallelized computations can be optimized by performing, for example, leading-zero initialization for a maximum number of possible flits, rather than an actual number of flits in the data packet. For lane i, the fixed value for the leading-zero initialization is the CRC of (i*(max number of flits)) zero symbols. The fixed value can be precomputed and stored in a CRC generator.

FIG. 1 illustrates a block diagram of an embodiment of an electronic circuit board 100 constructed according to the principles of the disclosure. The circuit board 100 can be, for example, a motherboard of a computer or part of a multi-chip module (MCM). The circuit board 100 includes a first device 110 and a second device 120 connected via a transmission medium 130. One skilled in the art will understand that the circuit board 100 can include other components that are not illustrated or discussed herein. Additionally, the circuit board 100 is an example of an electronic system. In other electronic system embodiments, the first device 110 and the second device 120 may not be on the same circuit board.

The first device 110 and the second device 120 may be different die or different packages on the circuit board 100. The first device 110 and the second device 120 can be either the same type of devices or different type of devices. In one embodiment, the first device 110 is a GPU and the second device 120 is a CPU. In other embodiments, the first device 110 and the second device 120 are both GPUs. In some embodiments, both the first device 110 and the second device 120 are CPUs. The first device 110 and the second device 120 can also be switches, repeaters, memory controllers, Network Interface Cards, etc. The first device 110 and the second device 120 communicate data packets from their associated data link layers across the transmission medium 130 via their transmitters and receivers. The data link layers deliver data from the data packets to a transaction layer for further processing. In some embodiments, the CRC computation and checking are performed in the data link layer.

The transmission medium 130 provides a communication path between the first device 110 and the second device 120. In one embodiment, the transmission medium 130 is wires. The wires can be conventional conductors typically employed on circuit boards to communicatively couple devices. In some embodiments discussed herein, the transmission medium 130 is a link that includes sixteen wires or lanes between the corresponding transmitter-receiver pairs. The transmission medium 130 includes a sub-link 132 of eight lanes that provides a point-to-point connection from a transmitter 111 of first device 110 to a receiver 124 of the second device 120. In some embodiments, differential wires are employed for communicating data. As such, two wires are employed for each lane. The transmission medium 130 includes an additional sub-link 134 of eight lanes that provides a point-to-point connection from a transmitter 128 of the second device 120 to a receiver 119 of the first device 110. One skilled in the art will understand that the first and second devices 110, 120, can include additional transmitter-receiver pairs and that the transmission medium 130 can include additional sub-links.

The transmitter 111 includes a CRC generator 112 and a CRC inserter 118. The CRC generator 112 is configured to generate a CRC code or CRC value for data packets sent by the transmitter 111. The CRC inserter 118 inserts the CRC value in the serial data stream being sent over the transmission medium 130 and the receiver 124 employs the CRC value to detect errors in the received data packets. The receiver 124 includes corresponding circuitry (not illustrated) to the CRC generator 112 to generate a CRC value for received data packets for comparison to the CRC value transmitted by the transmitter 111. The comparison can be performed on a per packet bases. Similarly, receiver 119 and transmitter 128 include CRC circuitry (not illustrated) to also provide the striping computation scheme as disclosed herein. The CRC generator 112 includes a CRC calculator 114 and combination circuitry 116.

The CRC calculator 114 is configured to define a CRC calculation of a data packet in sequential order and generate sub-CRC values by performing parallelized computations according to the sequential order and the multiple lanes of the transmission medium 130. The CRC calculator 114 is configured to perform the parallelized computations in real time and define the CRC in sequential order according to a symbol number and a flit number. FIG. 3 illustrates an embodiment of the parallelized computations that include initializing each calculation of the sub-CRC values with leading zeros except on Lane 0. The CRC calculator 114 is further configured to adjust each of the sub-CRCs for trailing zeros.

In another embodiment, leading zero initialization employs a fixed value that is based on the maximum number of possible flits rather than the actual number of flits in the data packet. In this embodiment, a precomputed value can be employed for leading zero initialization that is based on the maximum packet size and lane number. The trailing zero adjustment for this embodiment is then a variable number of zeros based on the difference of the maximum packet size and the actual data flits. Alternatively, a precomputed value for trailing zero adjustment could be used based on the maximum packet size and the lane number. When using the precomputed value for the trailing zero adjustment, the leading zero initialization is then a variable number of zeros based on the difference of the maximum packet size and the actual data flits.

In one embodiment, the CRC calculator 114 employs a 25 bit CRC. The CRC polynomial is 0x1024240, or $x^{25}+x^{18}+x^{15}+x^{10}+x^{7}+1$. In this embodiment, the CRC provides up to 5 bit error detect over a maximum payload of 4096 bits (32 flits), and a burst error detect of up to 25 bits. In other embodiments, other CRC polynomials can be used by the CRC calculator 114. For example, CRC polynomial can be 0x21E8, or $x^{14}+x^{9}+x^{8}+x^{7}+x^{6}+x^{4}+1$. In this embodiment, the CRC provides up to 3 bit error detect over a maximum payload of 4096 bits (32 flits), and a burst error detect of up to 14 bits.

The CRC calculator 114 works as if the CRC polynomial is being applied to a serial bit stream but in practice the hardware or logic circuitry of the CRC calculator 114 parallelizes the computation. Burst errors in hardware are most likely to occur within a lane. The CRC calculator 114 advantageously detects these burst errors by computing on a per lane basis and then combines the sub-CRC values from the lanes to get the final CRC value. The CRC calculator 114 employs the leading or trailing zeroes in place of the CRC value. The CRC calculator 114 can be located in the physical layer of the transmitter 111.

The combination circuitry 116 is configured to combine the sub-CRC values to provide the CRC value for the packet. In one embodiment, the combination circuitry 116 is XOR logic circuitry that is configured to combine the sub-CRC values to obtain the CRC value for the data packet. The combination circuitry 116 and the CRC calculator 114 can be located in the data link layer.

The CRC value is then provided to the CRC inserter 118 that is configured to add the CRC value into the data packet for transmission to the receiver 124. The CRC inserter 118 can be a conventional device.

Figure 2:
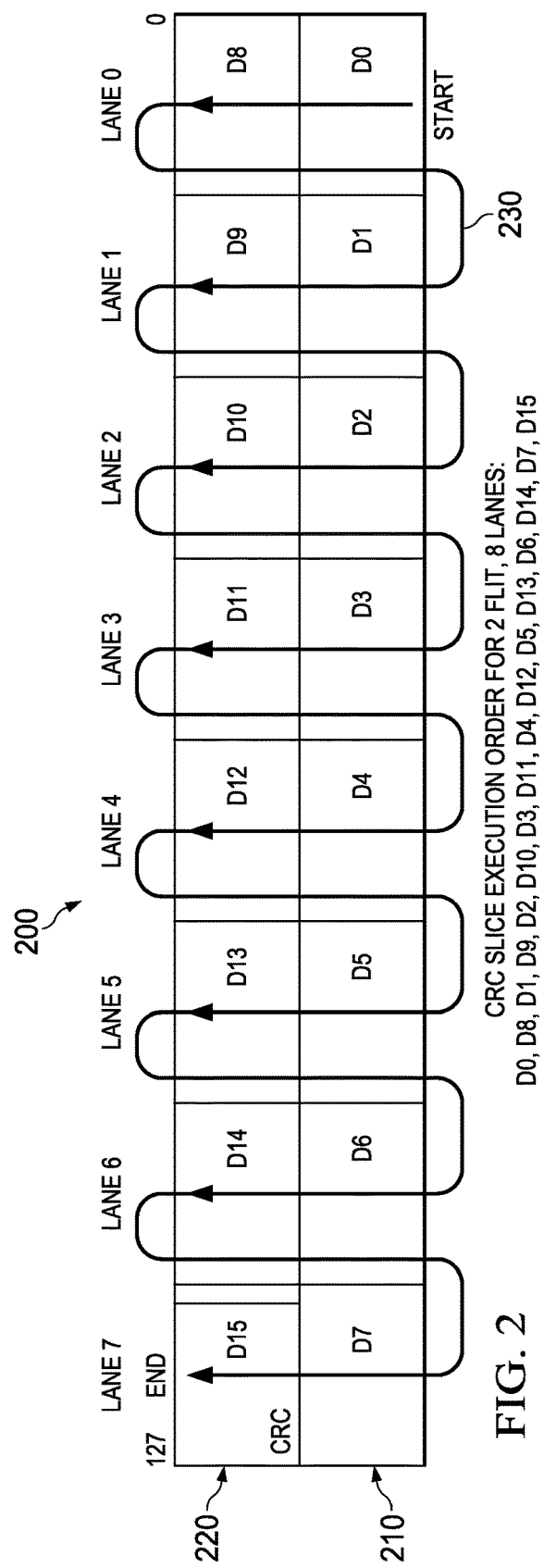
FIG. 2 illustrates a diagram representing an embodiment of a calculation order to define a CRC of a data packet sent over multiple lanes of a transmission medium.

FIG. 2 illustrates a diagram representing an embodiment of a calculation order 200 to define a CRC of a data packet sent over multiple lanes of a transmission medium. The calculation order 200 is for a data packet of two flits being transmitted over eight lanes. One skilled in the art will understand that the same ordering can be performed with a data packet having more than two flits. The two flits are a payload flit 210 and a header flit 220. The eight lanes are Lane 0 to Lane 7. Order line 230 illustrates the calculation order that indicates the actual sequential order of the data packet for symbols D0 to D15. The CRC calculator 114 can perform the calculation order 200 and parallelized computations, such as illustrated in FIG. 3.

FIG. 3 illustrates a diagram 300 representing an embodiment of an execution order for calculating a CRC for the data packet of FIG. 2 carried out according to the principles of the disclosure. Diagram 300 provides a slice of the data virtual-order used for calculations and illustrates one embodiment for using leading and trailing zeros for the parallelized computations across the eight lanes of FIG. 2. Each of the Lanes 0 to 7 is in time order. In this embodiment, symbol and flit size are based on a 1:16 clock conversion in the receiver. The clock ratios, however, can vary for different embodiments. For each clock cycle in this embodiment, each of the Lanes 0 to 7 will calculate a part or partial of the sub-CRC value for the lane. Lane 0 does the CRC calculation on bits 15:0 of each flit. Lane 7 does the CRC calculation on bits 127:112 of each flit. Lane 7 will substitute 14 zeroes for the CRC field in its calculations. The other lanes cover the 16 bit wide portions of each flit in between lanes 0 and 7. When the calculation is done for the last flit (e.g., the header flit 220), the lane results for each of the sub-CRC values are combined to calculate the CRC result. The resulting CRC value is mathematically the same result that would have been calculated for a serial stream of bits shown in the FIG. 2 along order line 230 from Start to End.

Figure 4:
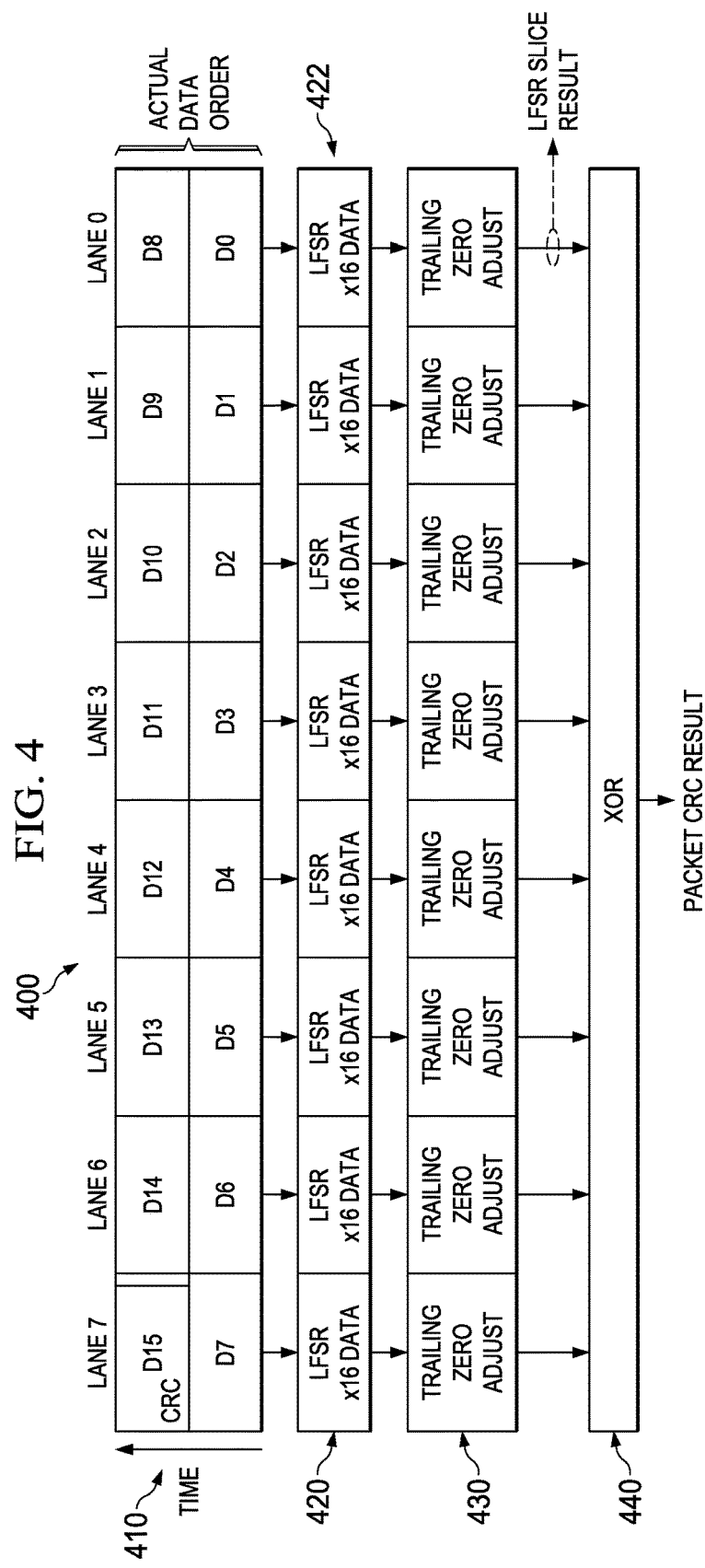
FIG. 4 illustrates a flow diagram of an embodiment of a method of generating a CRC value for the packet of FIG. 2 according to the principles of the disclosure.

FIG. 4 illustrates a flow diagram of an embodiment of a method 400 of generating a CRC value for the packet of FIG. 2 according to the principles of the disclosure. The method 400 can be performed by a CRC generator as disclosed herein, such as the CRC generator 112 of FIG. 1. FIG. 4 includes circuitry that is used to perform at least some of the steps of method 400. The method 400 begins in a step 410 wherein the data packet is received in actual order for transmission. The data packet in the actual transmission order can be received by the CRC generator 112 as noted in FIG. 1.

In a step 420, the sub-CRC values are computed in parallel. In the illustrated embodiment each sub-CRC values are calculated by the LFSR of each lane. The sub-CRC values are calculated in real time as the data packet is readied for transmission. In one embodiment, the sub-CRC values are calculated according to the parallelized computations represented in FIG. 3 using the LFSR. In other embodiments, the sub-CRC values are calculated using the LFSR and a fixed, precomputed value for leading or trailing zero adjustments.

Consider for example an embodiment that employs the 25 degree polynomial and a fixed value for leading zero initialization. Each LFSR has an internal state that is reset at each data packet. Since a fixed value is being used, within each lane each LFSR is started at the same place for each new packet. The initial value of the LFSR is called the seed and the seed for Lane 0 is 25 bits of ones. The seed for the other lanes, Lanes 2-7, is 25 bits of zeros. The LFSR of each lane computes the sub-CRC value for that lane such that the sub-CRC covers the data transmitted on that lane for each flit of the data packet. Accordingly, LFSR 422 computes the sub-CRC for Lane 0 that provides a CRC for the data transmitted on Lane 0 in order, (D0 and D8 in Lane 0 of FIG. 3) for two flits. Each part of the sub-CRC value is computed as the data D0 and D8 flows through the LFSR in Lane 0.

In a step 430, the trailing zeros of the sub-CRC values are adjusted. The trailing zeros can be adjusted based on the maximum packet size and the lane number. As illustrated in the embodiment of FIG. 3, the trailing zeros adjusted for Lane 0 is the data beat times seven.

In a step 440, the method 400 ends when the sub-CRC values are combined to obtain the CRC code for the packet. As illustrated in FIG. 4, the sub-CRC values can be combined by XOR logic.

Those skilled in the art to which this application relates will appreciate that other and further additions, deletions, substitutions and modifications may be made to the described embodiments.

What is claimed is:

1. A cyclic redundancy check (CRC) generator of a serial communications link having multiple lanes, comprising:
   a CRC calculator configured to define a CRC calculation of a data packet, for transmission on said multiple lanes, in sequential order and to perform parallelized computations on each lane of said multiple lanes based on said sequential order to generate sub-CRC values; and
   combination circuitry configured to combine said sub-CRC values to provide a final packet CRC value for said packet that maintains sequential error detection for said packet over said transmission on said multiple lanes.

2. The CRC generator as recited in claim 1 wherein said CRC calculator is configured to define said CRC calculation in sequential order according to a symbol number and a flit number.

3. The CRC generator as recited in claim 1 wherein said CRC calculator is configured to perform said parallelized computations in real time.

4. The CRC generator as recited in claim 1 wherein said parallelized computations includes initializing all but one of said sub-CRC values calculations with leading zeros.

5. The CRC generator as recited in claim 1 wherein said parallelized computations employs a fixed value for leading zero initialization.

6. The CRC generator as recited in claim 4 wherein said CRC calculator is further configured to adjust each of said sub-CRC values for trailing zeros.

7. The CRC generator as recited in claim 1 wherein said combination circuitry is XOR logic circuitry.

8. A method for transmitting a data packet on a serial communications link having multiple lanes, comprising:
- defining a calculation for a cyclic redundancy check (CRC) value of a data packet in sequential order;
- calculating, in parallel, a sub-CRC value of said CRC value for each lane of said multiple lanes; and
- generating said CRC value for said data packet based on a combination of each said sub-CRC value, wherein said CRC value maintains sequential error detection for transmitting said data packet on said multiple lanes.

9. The method as recited in claim 8 wherein said calculating and said combining are performed in real time.

10. The method as recited in claim 8 further comprising employing leading zeros for calculating some of said sub-CRC values.

11. The method as recited in claim 8 wherein said calculating includes using a fixed value for leading zeros that is predetermined based on a maximum size of said data packet and a lane number.

12. The method as recited in claim 8 further comprising adjusting each said sub-CRC value for trailing zeros.

13. The method as recited in claim 12 wherein said adjusting includes employing a precomputed value for said trailing zeros.

14. The method as recited in claim 8 wherein at least part of said calculating is performed by linear feedback shift registers.

15. A circuit board, comprising:
- a first device;
- a second device; and
- a serial communications link having multiple lanes communicatively coupling said first device to said second device, said serial communications link including a transmitter having a cyclic redundancy check (CRC) generator comprising:
  - a CRC calculator configured to define, in sequential order, a CRC of a data packet to transmit over said multiple lanes and to perform parallelized computations on each of said multiple lanes based on said sequential order to generate sub-CRC values; and
  - combination circuitry configured to combine said sub-CRC values to provide a final packet CRC value for said data packet that maintains sequential error detection for said data packet in transmissions over said serial communications link.

16. The circuit board as recited in claim 15 wherein said CRC calculator is configured to define said CRC in sequential order according to a symbol number and a flit number.

17. The circuit board as recited in claim 15 wherein said CRC calculator is configured to perform said parallelized computations in real time.

18. The circuit board as recited in claim 15 wherein said parallelized computations include initializing some of said sub-CRC value calculations with leading zeros.

19. The circuit board as recited in claim 18 wherein a fixed value is used for said leading zero initializations.

20. The circuit board as recited in claim 15 wherein said CRC calculator is further configured to adjust each of said sub-CRCs for trailing zeros.

* * * * *